(12) United States Patent
Inoue et al.

(10) Patent No.: US 6,841,485 B1
(45) Date of Patent: Jan. 11, 2005

(54) METHOD OF MANUFACTURING SEMICONDUCTOR DEVICE AND MANUFACTURING LINE THEREOF

(75) Inventors: Junichi Inoue, Nakakoma-gun (JP); Teruo Asakawa, Nakakoma-gun (JP); Kazuhiko Sugiyama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/958,970

(22) PCT Filed: Apr. 11, 2000

(86) PCT No.: PCT/JP00/02351
§ 371 (c)(1),
(2), (4) Date: Dec. 6, 2001

(87) PCT Pub. No.: WO00/63953
PCT Pub. Date: Oct. 26, 2000

(30) Foreign Application Priority Data

Apr. 16, 1999 (JP) .......................................... 11/109376

(51) Int. Cl.[7] .......................................... H01L 21/302
(52) U.S. Cl. ...................... 438/716; 438/716; 438/689
(58) Field of Search .............................. 257/265, 758, 257/700, 750; 428/446; 438/8; 700/715; 416/162

(56) References Cited

U.S. PATENT DOCUMENTS 5,371,037 A * 12/1994 Yonehara .................... 438/459
5,761,481 A * 6/1998 Kadoch et al. ................ 703/2
5,792,272 A * 8/1998 van Os et al. ........... 118/723 R
5,808,361 A * 9/1998 Bui ............................ 257/750
5,841,660 A * 11/1998 Robinson et al. ........... 700/115
6,150,031 A * 11/2000 Yonehara ................... 428/446
6,276,898 B1 * 8/2001 Elliott ........................ 416/162
6,281,024 B1 * 8/2001 Yoshitake et al. ............. 438/8

FOREIGN PATENT DOCUMENTS

| JP | 8-8318 | 1/1996 |
|---|---|---|
| JP | 8-111449 | 4/1996 |
| JP | 9-321139 | 12/1997 |

* cited by examiner

Primary Examiner—David Nelms
Assistant Examiner—Thinh T Nguyen
(74) Attorney, Agent, or Firm—Oblon, Spivak, McClelland, Maier & Neustadt, P.C.

(57) ABSTRACT

The present invention provides a semiconductor device manufacturing line for applying a series of processes on a semiconductor substrate, and forming an integrated circuit on the semiconductor substrate by employing a semiconductor wafer having a diameter of 6 inches (150±3 mm: SEAJ specification) or less for the semiconductor substrate. This manufacturing line comprises two sub-lines conforming to the same specifications, each of these sub-lines is composed of a series of processing units including a film forming unit, a pattern exposure unit, an etching unit, and a test unit. In at least one pattern exposure unit and one etching unit, fine processing of 0.3 μm or less can be performed.

16 Claims, 12 Drawing Sheets

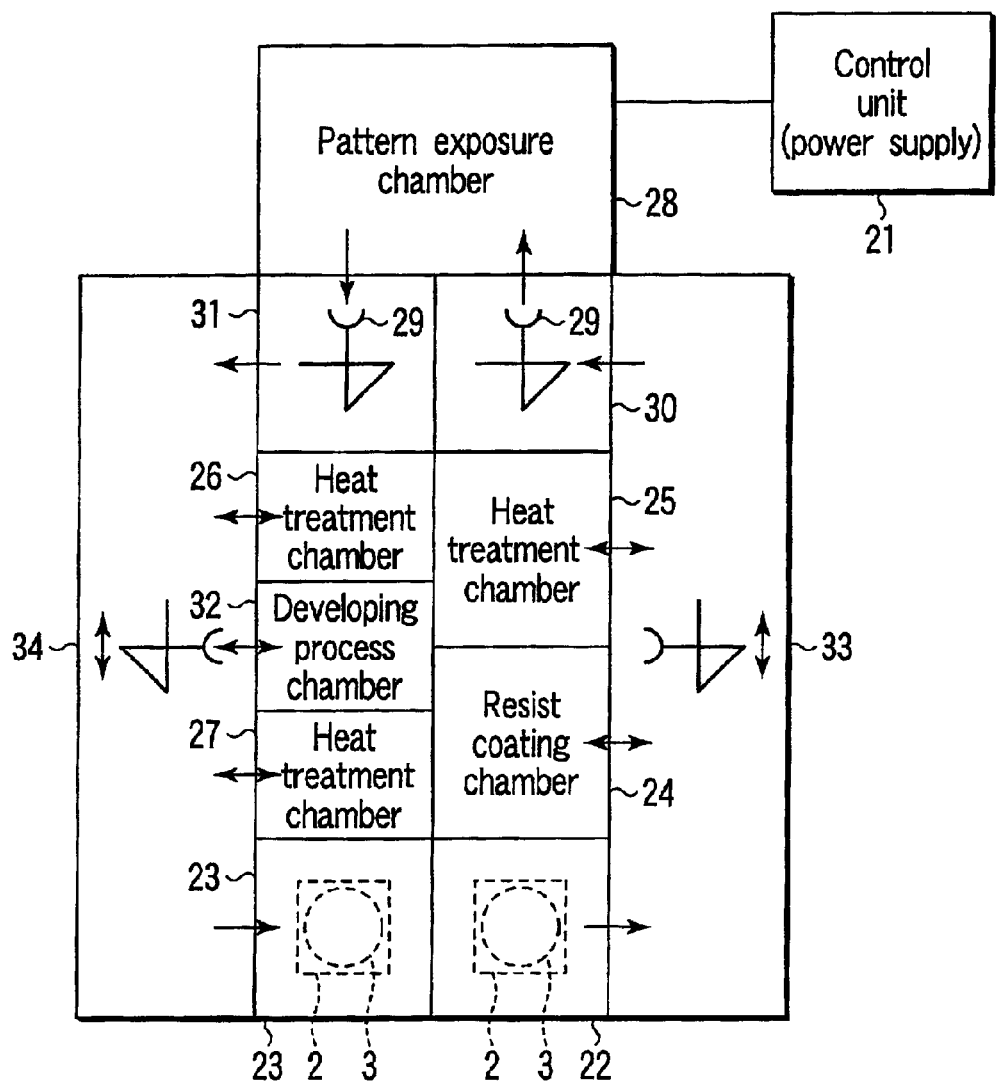
F I G. 2

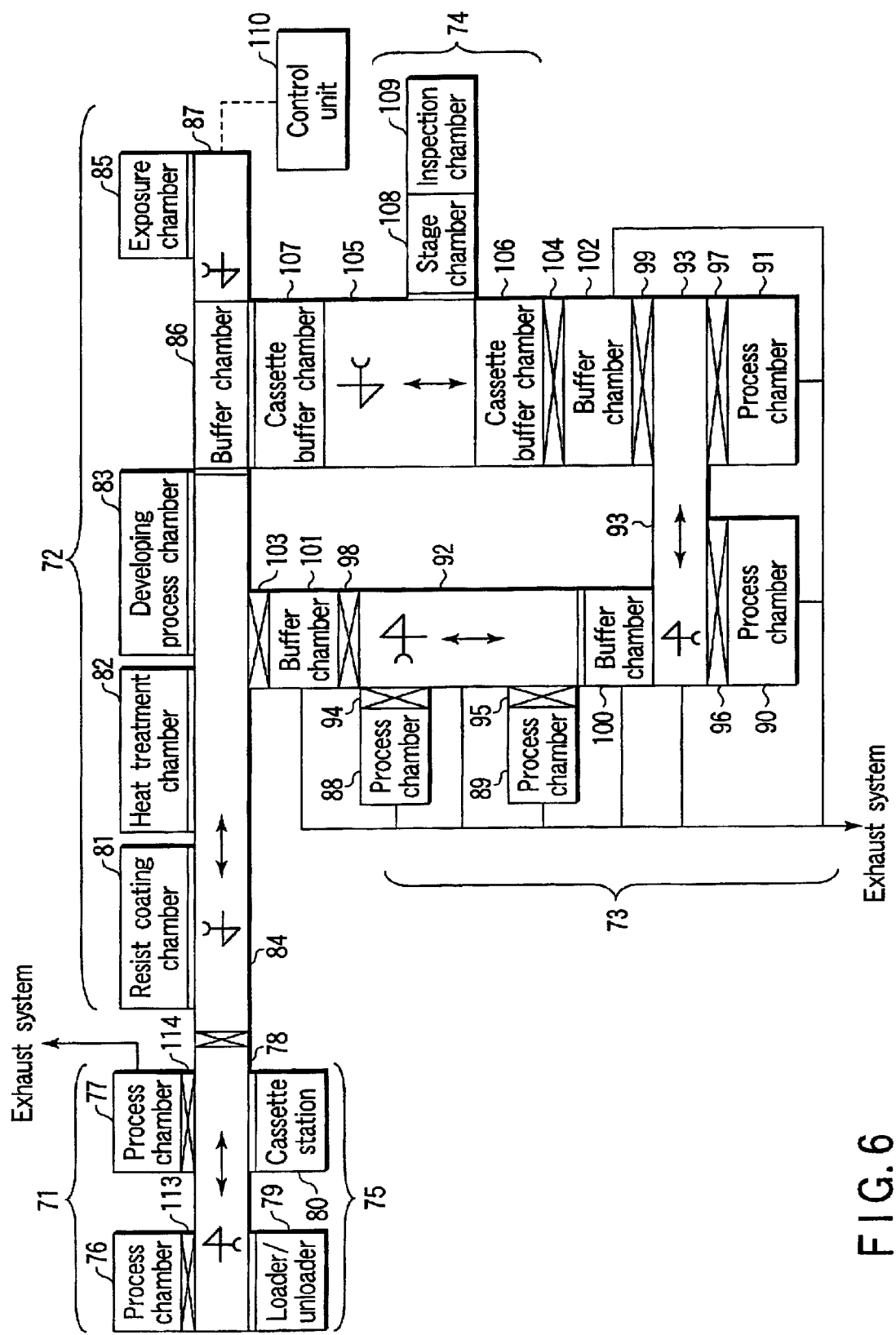
F I G. 6

METHOD OF MANUFACTURING SEMICONDUCTOR DEVICE AND MANUFACTURING LINE THEREOF

TECHNICAL FIELD

The present invention relates to a semiconductor device manufacturing method and its manufacturing line for manufacturing a semiconductor integrated circuit on a semiconductor wafer with high cost efficiency by employing a processing unit for carrying out film forming/etching or the like, the processing unit achieving primarily 0.3 μm or less in minimum processing dimensions of constituent elements formed on a semiconductor substrate.

BACKGROUND ART

In recent years, there have been manufactured semiconductor memories of 64 MDRAM/0.25 μm (the minimum processing line width) in 8-inch wafer (200±4 mm: SEAJ specification). In addition, development of semiconductor memories of 256 MDRAM/0.18 to 0.25 μm is newly underway. In conventional technology development, there has been a trend that a storage capacity increases by about 4 times approximately every three years.

Profitability has been improved based on the general rule that, when shrinking (reduction of the minimum processing line width) in a design rule and an increase in wafer size are carried out simultaneously, the yield per wafer is increased by four times.

However, the simultaneous advancement of fining and an increased diameter of wafer size cause a problem such as an increased amount of money for equipment investment or extended development period. In particular, when the time for conversion from 8 inches into 300 mm has come, as the manufacture of 1 G DRAM becomes feasible with respect to the storage capacity, such a problem is currently the major concern.

In the case where a wafer size is changed from 8 inches to 300 mm, when a consistent line is constructed, it is expected that the amount of money for research & development will exceed 200,000,000,000 Yen, and that the development period requires two times longer than conventionally. As a result, an increased amount of money for equipment investment causes an increase in depreciation cost, and an extended development period causes an increase in running costs. As a result, the profitability of semiconductor device manufacturers would be lowered. In order to improve this, restriction of increased equipment cost, reduction of COO, improvement of equipment throughput or the like is required.

Conventionally, since reduction in the design rule and an increase in diameter of a wafer resulted in higher costs of manufacturing apparatus and raw materials including wafers, manufacturing lines were directed to fabricate a few limited types of product in rather large quantity.

However, according to the needs of, for example, a hybrid LSI or the like in which a plurality of constituent elements consisting of analog and digital circuits are formed on one substrate, a processing technology is required, which allows controllability over small quantity of production of many types of products.

A conventional manufacturing line originally restricts the type of semiconductor device to be manufactured. Thus, although the above conventional manufacturing line is suitable for mass-production such as DRAM, it becomes unable to correspond to processing steps that substantially differ from a predetermined processing step and substantial displacement change or modifications are required because of changes in the processing steps. Thus, the cost and man hours associated with changes becomes prohibitively high, and profitability expected for such an investment cannot be guaranteed.

DISCLOSURE OF INVENTION

It is an object of the present invention to provide a semiconductor device manufacturing method and its manufacturing line for forming an integrated circuit of 0.3 μm or less in the minimum processing dimension of constituent elements formed on a semiconductor substrate at a low cost, the manufacturing method and line being capable of coping with changes in processing steps easily and flexibly, the manufacturing method and line being compatible with a plurality of wafer sizes.

In order to achieve the foregoing object, according to the present invention, there is provided a semiconductor device manufacturing method comprising the processing step in which the minimum processing dimensions of constituent elements formed on the semiconductor substrate are 0.3 μm or less, wherein a semiconductor wafer having a diameter of 6 inches (150±3 mm: SEAJ specification) or less is employed for the above semiconductor substrate.

In addition, according to the present invention, there is provided a semiconductor device manufacturing line for applying a series of processing functions to a semiconductor substrate, thereby forming an integrated circuit on the semiconductor substrate. The manufacturing line comprises two sub-lines in accordance with the same specification, each of which is composed of a series of processing units that contains a film forming unit, a pattern exposure unit, an etching unit, and a testing unit. In at least one pattern exposure unit and at least one etching unit, a fine processing of 0.3 μm or less can be performed. Additionally, the manufacturing line has means for transferring a semiconductor substrate being processed, between the two sub lines.

In the present invention, in a semiconductor device manufacturing method comprising a processing step in which the minimum processing dimensions of constituent elements formed on the semiconductor substrate are 0.3 μm or less, a semiconductor wafer of 6 inches or less in diameter is employed for a semiconductor substrate, thereby to reduce cost and increase yields. In addition, there is provided a manufacturing line in which the processing unit or processing chamber disposed in the manufacturing line is plugged into a transport system, and then, is removably connected, thereby facilitating replacement, addition or removal of the processing unit, and use of the processing unit in the manufacturing line is substituted by arbitrarily making annular connection for the transport system or making parallel connection with a path line being interposed.

In carrying out the present invention, means for solving the problems will be briefly described here.

Table 1 shows the relationship between the amount of money for investment in each wafer diameter and a memory capacity. FIG. 11 is a graph representing such a relationship.

TABLE 1

| | Wafer size (diameter) | | | | | | | | | |
|---|---|---|---|---|---|---|---|---|---|---|
| | 4 (inch) | | 5 (inch) | | 6 (inch) | | 8 (inch) | | 300 (mm) | |
| Memory capacity (bit) | 4K | 16K | 64K | 256K | 1M | 4M | 16M | 63M | 256M | Remarks |
| Amount of money for investment (100 million yen) | (52) | (88) | (148) | 250 | 450 | 600 | 850 | 1297 | 2199 | VLSI research |
| Relative value | 0.04 | 0.07 | 0.11 | 0.19 | 0.35 | 0.46 | 0.66 | 1 | 1.7 | 8 inch/64M is defined as 1. |
| Average value | 70 | | 199 | | 525 | | 1073.5 | | 2199 | Average amount of money for investment (100 million yen) |
| Relative value | 0.07 | | 0.19 | | 0.49 | | 1 | | 2.05 | Relative value |

This table shows the relationship between memory capacity and amount of money for investment in each wafer diameter when the amount of money for investment relevant to a consistent line of 8 (inch)/0.25 $\mu$m (64 MDRAM) is defined as "1" (relative value).

As is evident from this table, a variation rate during conversion from 8 inches into 300 mm is more significant as compared with another rate, and the amount of money for investment relevant to conversion into 300 mm is significantly increased.

In addition, table 2 shows the relationship between wafer diameter (the area for an integrated circuit forming region) and a semiconductor device. FIG. 12 is a graph representing such a relationship.

TABLE 2

| | | Wafer size (diameter) | | | | | |
|---|---|---|---|---|---|---|---|
| | | 4 (inch) | 5 (inch) | 6 (inch) | 8 (inch) | 300 (mm) | Remarks |
| Area | Effective area (mm²) | 2381 π | 3782 π | 5505 π | 9920 π | 21904 π | The wafer shape is assumed to be circular, and calculation is carried out when the effective aperture = (diameter − 4) mm (values rounded up/down to nearest whole number) |
| | Relative value | 0.24 | 0.38 | 0.56 | 1 | 2.21 | 8 inch is defined as 1. |
| Yields | Chip size 100 mm² | 74 | 118 | 172 | 311 | 687 | |
| | Relative value | 0.24 | 0.38 | 0.55 | 1 | 2.21 | |
| | Chip size 400 mm² | 18 | 29 | 43 | 77 | 171 | |
| | Relative value | 0.23 | 0.38 | 0.56 | 1 | 2.22 | |

As shown in this table, the yield (the number of chips that can be yielded from one wafer in the case where the yield is 100%) is proportional to wafer diameter. In order to manufacture the same quantity, it is assumed that the following number of manufacturing lines are required.

| | | |
|---|---|---|
| 300 mm 1/2.21 = 0.45 | | ½ line |
| 8 inches 1/1 = 1 | | 1 line |
| 6 inches 1/0.56 = 1.76 | | 2 lines |
| 5 inches 1/0.38 = 2.63 (125 ± 2 mm: SEAJ specification) | | 3 lines |
| 4 inches 1/0.24 = 4.17 (100 ± 2 mm: SEAJ specification) | | 5 lines |

Table 3 shows the relationship between the relative value of the amount of money for investment and the relative value of yield relevant to each wafer diameter. FIG. 13 is a graph representing such a relationship.

TABLE 3

| | Wafer size (diameter) | | | | |
|---|---|---|---|---|---|
| | 4 (inch) | 5 (inch) | 6 (inch) | 8 (inch) | 300 (mm) |
| Relative value of amount of money for investment | 0.07 | 0.19 | 0.49 | 1 | 1.7 |
| Relative value of yield | 0.24 | 0.38 | 0.56 | 1 | 2.21 |

In this table, if it is judged that, when the relative value of the yield is greater than that of the amount of money for investment, profitability is higher, when manufacturing is carried out in the same manufacturing process, an improved profit relevant to the amount of money for investment can be expected when the diameter is increased to 300 mm or is decreased to 6 inches or less. Further, assuming that these increases and decreases are actually carried out in the same manufacturing process, the relationship between the relative value of the amount of money for investment and production quantity (yield) as shown in Table 4 is obtained for each wafer size. FIG. 14 is a graph representing such a relationship.

TABLE 4

|  |  |  | Wafer size (diameter) | | | | |
|---|---|---|---|---|---|---|---|
|  |  |  | 4 (inch) | 5 (inch) | 6 (inch) | 8 (inch) | 300 (mm) |
|  | Relative value of amount of money for investment | | 0.07 | 0.19 | 0.49 | 1 | 1.7 |
| Production quantity | × 1 | Required number of lines | 5 | 3 | 2 | 1 | 0.5 |
|  |  | Investment × line | 0.35 | 0.57 | 0.94 | 1 | 0.85 |
|  | × 2 | Required number of lines | 9 (10) | 6 | 4 | 2 | 1 |
|  |  | Investment × line | 0.63 (0.7) | 1.14 | 1.96 | 2 | 1.7 |
|  | × 4 | Required number of lines | 17 (18) | 11 (12) | 8 | 4 | 2 |
|  |  | Investment × line | 1.19 (1.4) | 2.09 (2.28) | 3.92 | 4 | 3.4 |

It can be understood from this table that the use of small wafer of 5 or 6 inches is better in investment efficiency than a large diameter of 300 mm in wafer size.

In addition, in the case where a wafer size of 8 inches or more is employed, if the wafer is damaged due to a wrong process or carrying trouble and the like, the number of chips on one wafer is large. Thus, the yield is significantly lowered. In this case as well, a wafer of a smaller diameter size with less chips on it less influences the yield.

BRIEF DESCRIPTION OF THE DRAWINGS

FIG. 2 is a view showing a conceptual configuration of a resist processing and exposure unit for photolithography technique employed for the semiconductor device manufacturing method of the first embodiment;

FIG. 6 is view showing an exemplary conceptual configuration of a manufacturing line according to a third embodiment;

BEST MODE FOR CARRYING OUT OF THE INVENTION

Hereinafter, preferred embodiments of the present invention will be described in detail.

Figure 1:
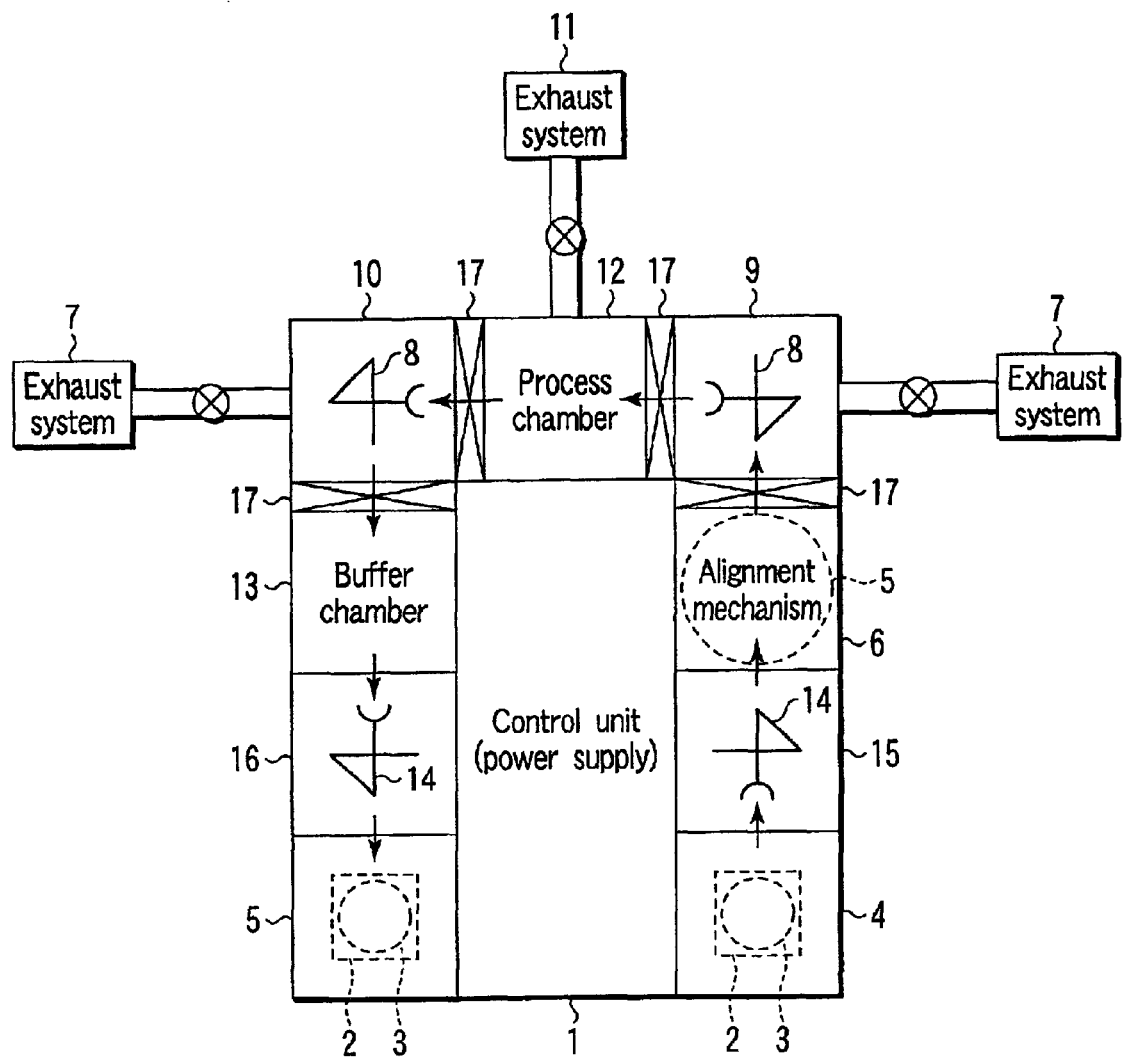
FIG. 1 is a view showing an exemplary conceptual configuration of a semiconductor manufacturing apparatus employed for a semiconductor device manufacturing method according to a first embodiment of the present invention.

FIG. 1 illustrates an exemplary conceptual configuration of a semiconductor manufacturing apparatus used for a semiconductor device manufacturing method according to the present invention.

The semiconductor manufacturing line employed in the present embodiment is an apparatus that enables processing of 0.3 $\mu$m or less in the minimum processing dimension in processing steps, and carries out processing steps for a semiconductor substrate (wafer) of 6 inches or less in wafer diameter as described later.

This semiconductor manufacturing apparatus is composed of: surrounding a control unit 1 that controls the entirety of a loader 4 and an unloader 5 for mounting a carrier cassette 2 capable of housing a wafer 3 and importing/exporting a wafer 3 on a single wafer mode; an alignment chamber 6 comprising an alignment mechanism 5 for carrying out alignment of the wafer 3; load lock chambers 9 and 10 each comprising an exhaust system 7 and a carrying mechanism 8; a process chamber 12 comprising an exhaust system 11 for processing the wafer 3 in a predetermined manner; a buffer chamber 13 for temporarily stocking the processed wafer 3; and carrying mechanisms 15 and 16 each having an arm 14 or the like to be driven in X-Y-Z-θ directions for delivering a wafer between chambers.

A gate valve 17 that can be maintained with air tightness so that the vacuum in the chamber is maintained is provided, respectively, between the process chamber 12 and each of the load lock chambers 9 and 10, between the load lock chamber 9 and the alignment chamber 6, and between the load lock chamber 10 and the buffer chamber 13. In addition, the control unit 1 contains a power source for supplying power. The wafer 3 is transferred in the illustrated arrow direction.

The process chamber 12 carries out wafer processing such as a thin film forming process, an etching process, an impurity introducing process, and metal film forming process.

There is provided a processing mechanism for carrying out any of the thin film forming processes including heat treatment such as an atmospheric pressure CVD (Chemical Vapor Deposition), a low-pressure CVD, a diffusion furnace, a PRT (Rapid Thermal Processing); a plasma CDV; or annealing process.

There is provided a processing mechanism for carrying out any of the above etching processes including poly-Si etching, oxide film etching, and metal etching. As the impurity introducing process, there is a processing mechanism for carrying out either an ion introducing process or a thermal diffusion process. There is a processing mechanism for carrying out the above metal film forming processes such as thermal CVD, plasma CVD, sputtering process (PVD) or thermal treatment.

In the thus configured semiconductor manufacturing apparatus, a carrier cassette 2 having a plurality of wafers 3 housed in a loader 4 is mounted, and a vacant carrier cassette 2 is mounted on an unloader 5.

Next, a wafer 3 is removed from the carrier cassette 2 of the loader 4 by means of a carrying mechanism 14, the removed wafer is delivered to an alignment mechanism in an alignment chamber 6, and alignment of the wafer 3 is transferred so as to be set at a predetermined position of a processing mechanism (not shown) in a process chamber 12. The aligned wafer 3 is imported into a load lock chamber 9. The load lock chamber 9 is decompressed by means of an exhaust system 7 up to a pressure equal to that of the process chamber 12, and the wafer 3 is delivered to a processing mechanism in the process chamber 12 by means of a carrying mechanism 8 provided in the chamber.

Then, the wafer 3 processed in the process chamber 12 is temporarily stored in a buffer chamber 13 through a load lock chamber 10. When the wafer 3 is stocked in the buffer chamber 13 in predetermined numbers or in numbers that corresponds to carrier storage, these wafers 3 are stored in a vacant carrier cassette 2 mounted on the unloader 5 by means of a carrying mechanism 14.

FIG. 2 shows and describes a conceptual configuration of a resist processing/exposure unit for a photolithography technique employed in the semiconductor device manufacturing method according to the present embodiment.

The exposure unit according to the present embodiment is a unit capable of forming a minimum pattern line width of 0.3 $\mu$m or less relevant to a semiconductor substrate (wafer) of 6 inches or less in wafer diameter and carries out processing as described later.

This resist processing/exposure unit is entirely controlled by means of a control unit 21. This unit is composed of: a loader 22 and an unloader 23 for mounting a carrier cassette 2 capable of housing a wafer 3 and capable of importing and exporting the wafer in a single-wafer mode; a resist coating chamber 24 that consists of a spin coater or the like for coating a resist to the wafer 3; heating process chambers 25, 26, and 27 for carrying out the baking processing to the wafer 3 to which the resist has been coated; a pattern exposure chamber 28 for carrying out exposure with a KrF excimer laser or an ArF excimer laser and the like being a light source; exposure chamber interfaces 30 and 31 each comprising a carrying mechanism 29 for importing/exporting the baking processed wafer 3 into/from a pattern exposure chamber 28; a development process chamber 32 for carrying out development (spin developer processing) while rotating the exposed wafer 3, thereby forming a mask pattern; and carrying mechanisms 33 and 34 for carrying a wafer between respective chambers other than a pattern exposure chamber 28.

However, although FIG. 2 illustrates that the control unit 21 controls the entire constituent units by being connected to the pattern exposure chamber 28 only, this is merely conceptually shown. In the case where this unit is actually configured, the control unit is provided in the respective chambers, and a design may be made such that there is provided a host-like control unit for sending an integral instructions to these control units.

In the processing by this processing unit, a carrier cassette 2 having a plurality of wafers 3 housed in a loader 22 is mounted, a wafer 3 is imported into a resist coating chamber 24 by means of a carrying mechanism 33, and a resist is coated to the wafer 3. Thereafter, the wafer to which a resist is coated by is placed by the carrying mechanism on the hot plate (not shown) in a heat treatment chamber 25, a pre-baking processing is coated to the wafer 3 before exposure.

Next, by means of carrying mechanism of the exposure chamber interface 29, the backed wafer 3 is placed at a wafer stage (not shown) in a pattern exposure chamber 28, alignment is carried out by an alignment mark, and then, exposure is carried out. The exposed wafer 3 placed on a hot plate (not shown) in a heat treatment chamber 26 by means of a carrying mechanism 34 through an exposure chamber interface 31, and baking processing before development is applied. Then, the baking wafer 3 is imported into a development process chamber 32, the wafer 3 is developed while rotating the wafer, and a mask pattern is formed.

Further, in the heat treatment chamber 27, post-baking processing is applied. This post baking wafer 3 is housed in a vacant carrier cassette mounted on an unloader 23 by means of a carrying mechanism 34.

Figure 3:
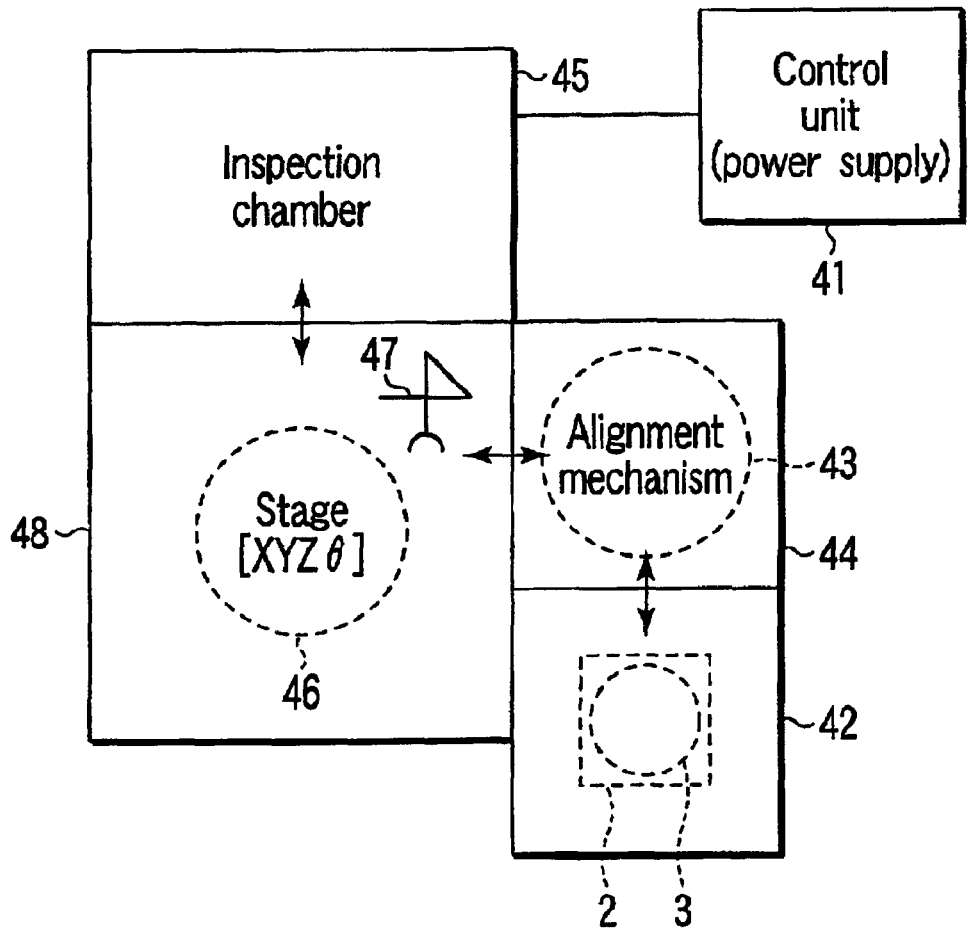
FIG. 3 is a view showing a conceptual configuration of an inspection unit employed for the semiconductor manufacturing method according to the first embodiment.

Next, FIG. 3 illustrates a conceptual configuration of an inspection unit for carrying out optical or electrical inspection, employed in the semiconductor manufacturing method according to the present embodiment.

In the present embodiment, in a chamber, there is provided any of an optical inspection mechanism that consists of a microscope or an electronic microscope and the like for optically inspecting the shape of a resist pattern or wiring formed in minimum processing dimensions of 0.3 $\mu$m or less on a wafer of 6 inches or less in wafer size; a testing mechanism for inspecting electrical characteristics of a circuit pattern (wiring or electrodes) or integrated circuit elements and the like; and an aging mechanism for carrying out burn-in test.

This inspection unit is entirely controlled by means of a control unit 41. The inspection unit is composed of: a loader/unloader 42 for mounting a carrier cassette 2 capable of housing a wafer 3 and capable of importing/exporting the wafer 3 on a single wafer mode; an alignment chamber 44 comprising an alignment mechanism 43 for carrying out position assessments for inspections of wafer 3; an inspection chamber 45 for housing an inspection mechanism that carries out various inspections described previously; and a stage chamber 48 including a stage 46 driven in X-Y-Z-$\theta$ directions, a prober (not shown) for bringing probes into contact with the electrode or the like of the wafer, to achieve an electrical connection therewith, a light source and an inspection unit (either, not shown) for effecting optical inspection, and a carrying mechanism 47 for transferring the wafer 3 between the chambers. In the inspection chamber 45 and the stage chamber 48, optical or electrical inspection is carried out.

Although FIG. 3 illustrates that a control unit 41 is connected to an inspection chamber 45 only, and the entire constituent unit is controlled, this is merely conceptually shown. In the case where this unit is actually configured, a control unit is provided in respective chambers, and a design may be made such that there is provided a host-like control unit for sending an integral instruction to these control units.

The wafer sizes of semiconductor wafers targeted to be processed by the semiconductor manufacturing apparatus, resist processing/exposure unit, and inspection unit (hereinafter, these units are referred to as "processing units") according to the first embodiment described above include wafers of 6 inches or less, for example 2, 3, 4, 5, and 6 inches. To these wafers, there is applied fine processing in which a gate length of a wiring pattern or circuit element, for example, transistor electrode formed on a wafer is 0.3 µm or less.

These processing units each disposes a transport system that corresponds to a wafer of a single size equal to or smaller than 6 inches, and a process chamber can be selectively configured according to the processing steps such as film forming or etching.

Figure 4:
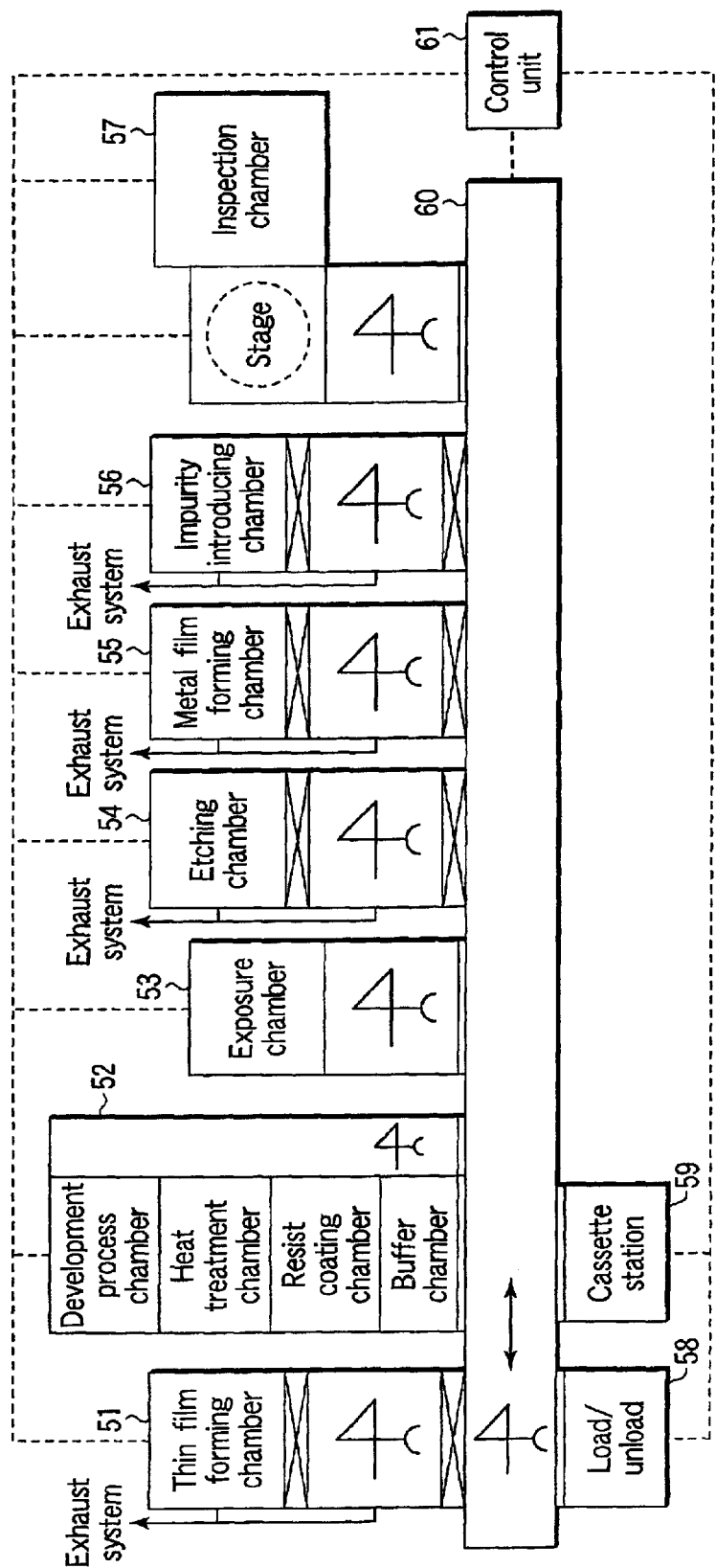
FIG. 4 is an exemplary conceptual configuration of a manufacturing line (sub-line) according to a second embodiment.

Now, FIG. 4 illustrates a conceptual configuration of a manufacturing line (sub-line) in which the previously described processing units are employed according to a second embodiment.

This manufacturing line has a plug-in configuration in which the previously described thin film forming unit 51, a resist processing unit 52, a pattern exposure unit 53, an etching unit 54, a metal film forming unit 55, an impurity introducing unit 56, an inspection unit 57, and a loader/unloader 58 and a cassette station 59 are linked with one transport system 60. This manufacturing line is configured as an example such that there is provided a control unit 61 for controlling the entirely configured unit. The plug-in configuration used here shows that each unit is connected to a transport system 60 so as to be easily mounted or removed. In addition, in a preferred embodiment, interfaces at a connection portion between a processing unit and a transport system are standardized, and allocation of the unit can be changed very easily.

This manufacturing line is targeted for processing wafers whose wafer sizes are equal to each other. The manufacturing line is configured to minimize the processing units in number so as to enable addition or deletion of the processing units according to changes in the processing steps, changes in manufacturing product type or changes in production quantity. At least one processing unit corresponding each process step is connected so as to be removably mounted, respectively, to a transport system 60.

Figure 5:
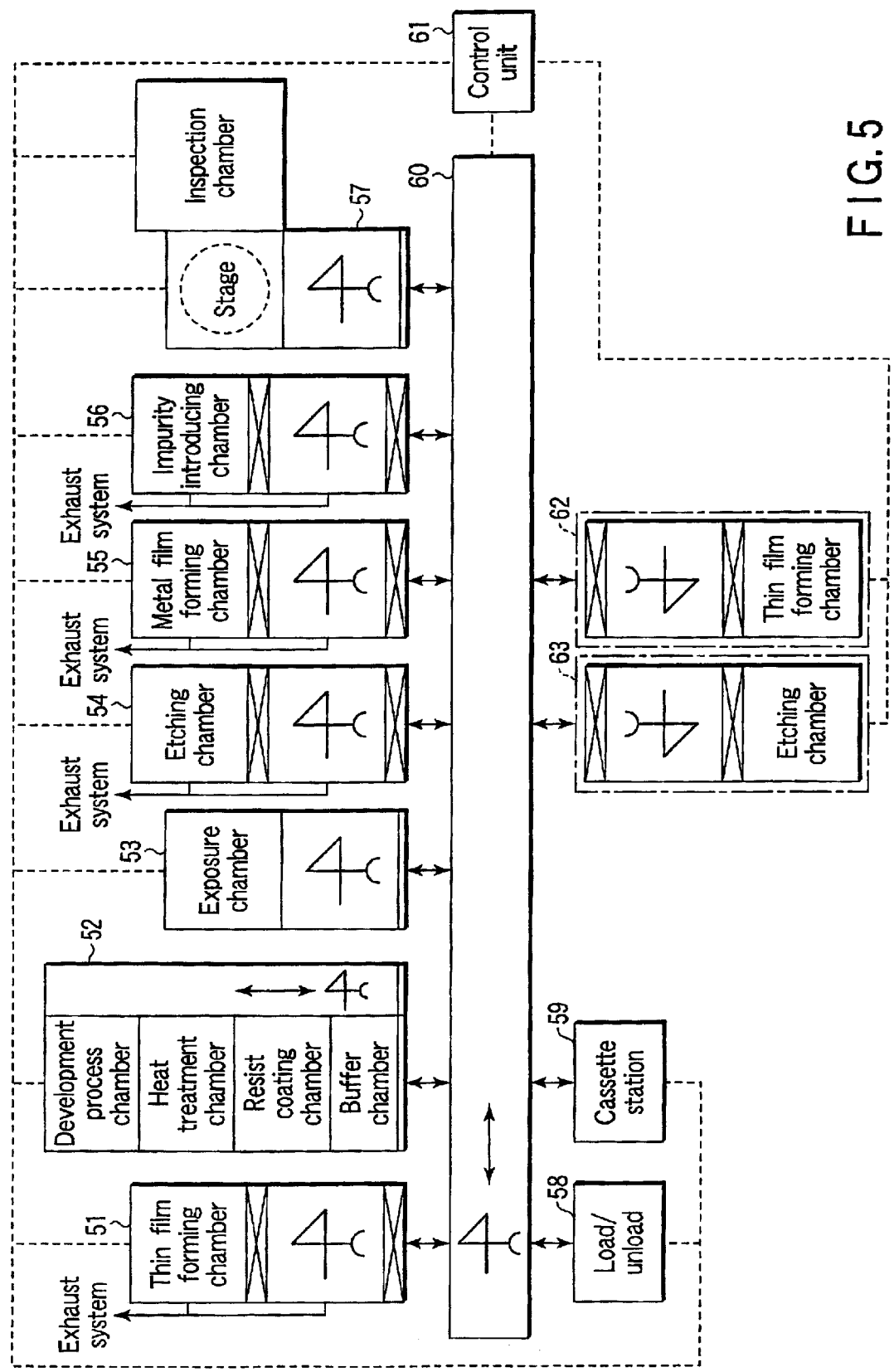
FIG. 5 is a view illustrating a plug-in configuration according to the second embodiment.

With this configuration, as shown in FIG. 5, respective processing units are independent of each other relevant to a transport system 60, and can be arbitrarily incorporated into or removed from the line. For example, in the case where the steps of carrying out additional thin film forming or etching should be increased in number due to changes in processing steps, the thin film forming unit 62 or etching unit 63 can be added in unit by unit. In addition, addition or deletion of each line unit can be carried out as well as addition of processing units.

In this plug-in configuration, the loader/unloader of each processing unit is configured so as to correspond to one wafer size only, and the carrying mode is on a single wafer mode. This loader/unloader carries a wafer in units of pieces corresponding to carrier cassette storage or in units of lots set in number. However, the carrying mode is not limited to the single wafer mode. There is no problem even if there is employed a cassette transport system for carrying carrier cassettes one by one. Each processing unit may not be connected to the transport system 60. The loader/unloader of the processing unit may be disposed at a position that can be accessed by means of a carrying mechanism of the transport system 60.

In the present embodiment, even a processing unit with different specification can be plug-in configured by using a loader/unloader in common, and a manufacturing line can be constructed by utilizing the existing processing unit.

FIG. 6 shows a modified example of a plug-in configured manufacturing line according to a third embodiment.

Although the previously described manufacturing line is constructed in processing units, this manufacturing line is plug-in configured by being linked with a transport system in units of chambers in the present embodiment. Although plug-in in processing units can utilize the existing unit, such a plug-in system requires a loading/unloading operation, which results in larger footprint and difficulty in unification of control protocol.

In the present embodiment, various processing chambers are configured to be connected to a standardized or substantially standardized transport system.

In the configuration shown in FIG. 6, sections are configured for every processing step. These sections are roughly divided into a preprocessing section 71, a resist pattern forming section 72, a thin film forming section 73, and an inspection section 74. Further, a wafer supply/re-collection section 75 for supplying and re-collecting a wafer is disposed.

The preprocessing section 71 carries out heat treatment such as RTP or cleaning processing for removing from a surface unnecessary objects, such as natural oxide film, formed on a wafer. For example, process chambers 76 and 77 each consist of a heat treatment chamber and an etching chamber, and are configured to be connected to an atmospheric transport system 78.

In addition, a wafer supply/re-collection section 75 is composed of a loader/unloader 79 and a cassette station 80, and is connected to the above transport system 78.

Next, a resist pattern forming section 72 forms a resist pattern for forming a circuit pattern or a circuit element on a wafer by employing a photolithography technique. This section consists of a resist processing portion and a pattern exposure portion. For example, the resist processing portion is configured so that a resist applying chamber 81 consisting of a spin coater or the like, a heat treatment chamber 82 for carrying out baking, and a developing process chamber 83 are each connected to a transport system 84. In addition, the pattern exposure portion have an exposure chamber 85 and a buffer chamber 86 for temporarily stocking a wafer are each connected to a transport system 87. With respect to the resist processing portion and pattern exposure portion to the transport systems 84 and 87 are connected to each other, via the buffer chamber 86.

The above thin film forming section 73 is configured so that, for example, four process chambers 88 to 91 are connected to transport systems 92 and 93 via gate valves 94 to 97, respectively. These transport systems 93 and 94 are connected to each other via a buffer chamber 100. In addition, to the other end as well, buffer chambers 101 and 102 functioning as load lock chambers are connected via gate valves 98 and 99. The above buffer chamber 101 is linked with the transport system 84 via the gate valve 103, thereby making it possible to deliver a wafer. In addition, the buffer chamber 102 is linked to a cassette buffer chamber 106 of an inspection section 74 described later via a gate valve 104.

Further, these chambers and transport systems having to each of exhaust systems enabling vacuum exhaustion. With this configuration, the buffer chamber and transport system can be maintained in a vacuum state.

The above inspection section 74 connects cassette buffer chambers 106 and 107 at both ends of the transport system 105. In addition, an inspection portion consisting of a stage chamber 108 and an inspection chamber 109 is linked with the transport system 105. Then, the cassette chamber 106 is connected to a buffer chamber 86 via a gate valve 104, and the cassette chamber 107 is connected to a buffer chamber 102. In addition, a control unit 110 for controlling the entirety is provided.

With this configuration, if an attention is paid to the transport system, a part of the transport system forms a loop. That is, this system have: first carrying means having at least one processing unit connected thereto; second carrying means having another processing unit connected thereto, the second carrying means being connected orthogonal to the first carrying unit; third carrying means having still another processing unit further connected thereto, the third carrying means being connected orthogonal to the second carrying means; and fourth carrying means having yet another processing unit further connected thereto, the fourth carrying means being connected orthogonal to the first carrying means and third carrying means.

Figure 7:
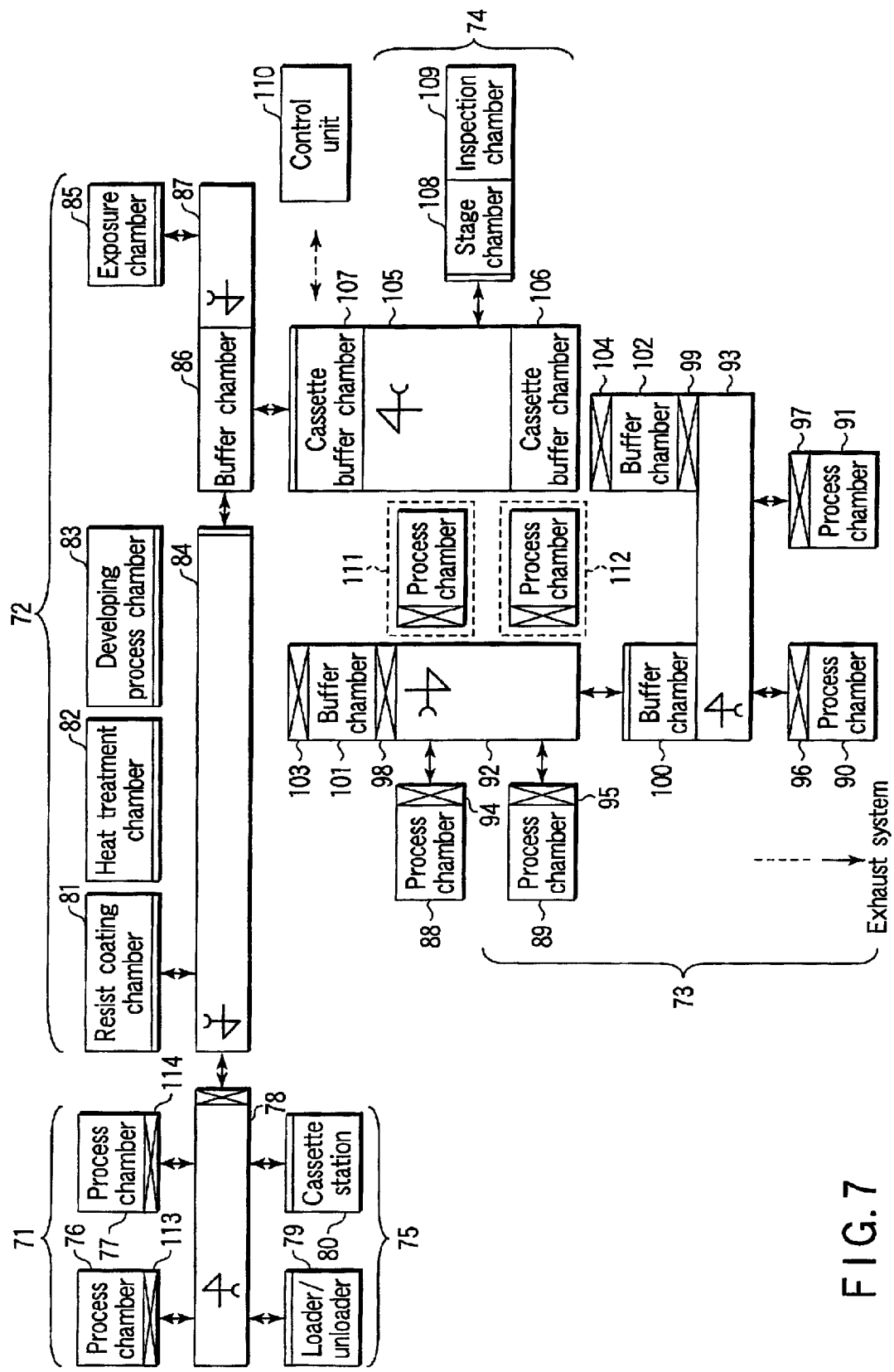
FIG. 7 is a view illustrating a plug-in configuration according to the third embodiment.

In this plug-in configured manufacturing line, as shown in FIG. 7, process chambers 111 and 112, for example, can be easily added according to changes in the processing steps or changes in the product type. Namely, replacement, addition, or removal can be easily carried out in units of chambers, which can cope with changes of the product type or changes of production quantity flexibly. Of course, replacement, addition, or removal can be easily carried out in units of sections as well.

In addition, in the transport systems as well, linking can be universally carried out, and thus, a linear transport system and a 0-shaped transport system can be constructed, making it possible to removably mount a transport system, a chamber, and a buffer in the middle of a line through plugging-in. Thus, a wafer in the middle of processing can be carried between lines mutually.

Further, in a thin film forming section 73 according to the present embodiment, a buffer chamber that functions as a load lock (vacuum preservation chamber) is disposed at both ends of the transport system, an exhaust system is provided in the transport system to establish a vacuum state, and vacuum carrying is carried out. This is because an external influence upon a wafer in the middle of process such as a case of forming a multiplayer film is prevented, and wafer carrying efficiency in a section is enhanced. However, in a configuration having a number of process chambers employing no vacuum in this section, with the transport system exposed to the atmospheric, a load lock chamber may be provided at a process chamber that requires a vacuum may be connected to the transport system. Preferable connection mode may be employed in consideration of manufacturing efficiency or carrying efficiency.

Figure 8:
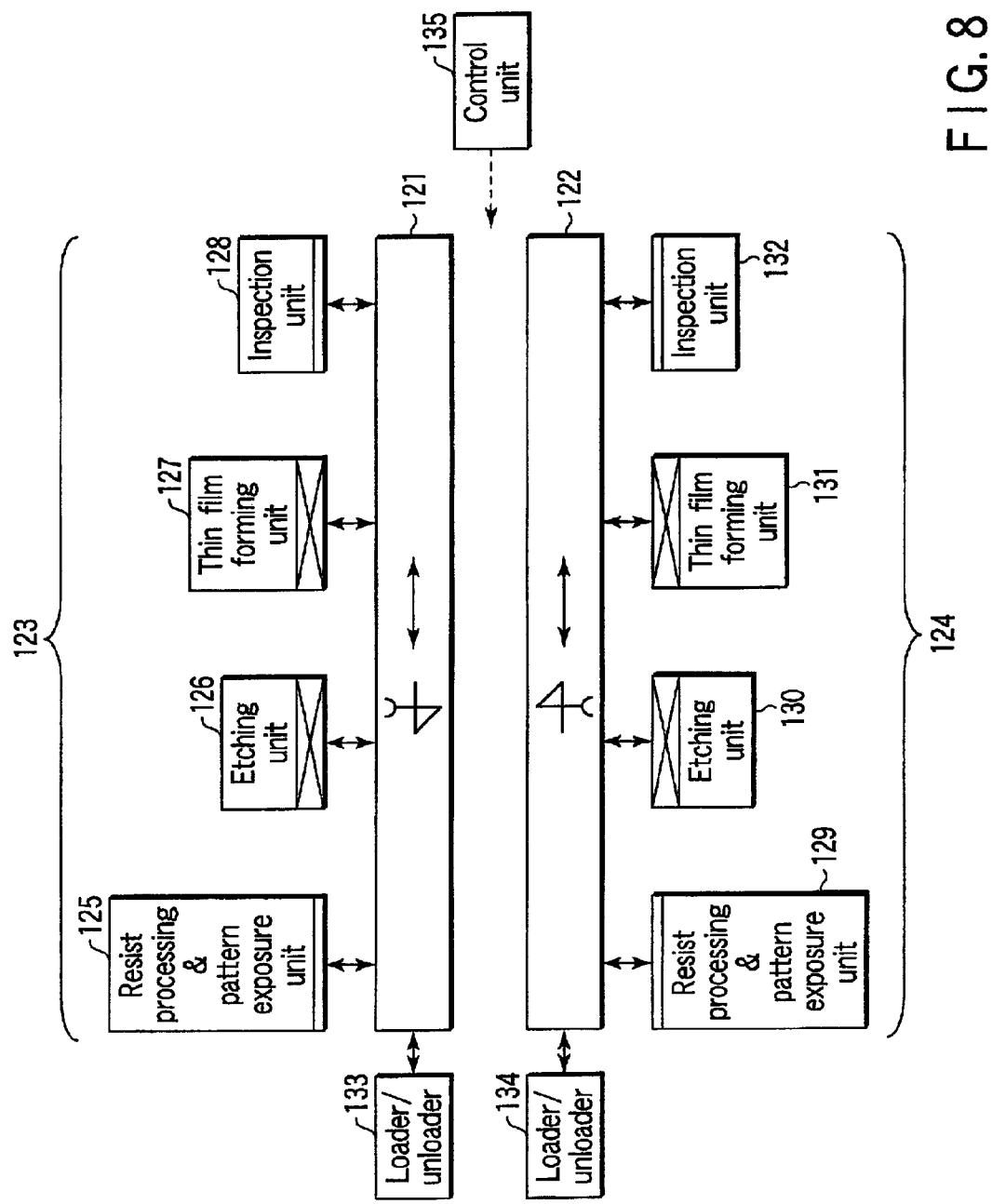
FIG. 8 is a view showing an exemplary conceptual configuration of a manufacturing line having two independent sub-lines that have plug-in configuration according to a fourth embodiment.

FIG. 8 describes a manufacturing line for processing wafers of differing sizes, according to the plug-in configuration according to a fourth embodiment.

According to a configuration of this manufacturing line, processing unit groups 123 and 124 each carrying out a series of processes for forming an integrated circuit are linked with a respective one of a plurality of transport systems (sub-lines) in which objective wafer sizes are different from each other.

For example, resist processing and pattern exposure units 125 and 129; etching units 126 and 130; thin film forming units 127 and 131; and inspection units 128 and 132 that correspond to the wafer sizes of the respective transport systems are connected to transport systems 121 and 122 for carrying two sizes of different wafers to be carried, 8-inch or larger, and 6-inch or smaller. In addition, loaders/unloaders 133 and 134 are provided at the respective transport systems 121 and 122, and a control unit 135 for controlling the entirety is provided.

In this configuration, the resist processing and pattern exposure units 125 and 129 and the etching units 126 and 130 are used as processing units capable of coping with forming of an integrated circuit of 0.3 $\mu$m or less in minimum processing line width. Of course, such fine processing is not always required, and a support for a minimum processing line width of either one sub-line to be 0.3 $\mu$m or less will suffice.

In the above line, wafers of two different sizes can be processed. In a wafer of a first size, an integrated circuit of a first chip size can be formed. In a wafer of a second size, an integrated circuit of a second chip size can be formed. If the chip sizes of integrated circuits are different from each other, when quantity, yield, and throughput are considered, the optimal wafer size may differ.

In such a case, this system and method capable of manufacturing integrated circuits of two or more types by using a semiconductor substrate of an optimal wafer size are useful.

In addition, in the present embodiment, one sub-line is for wafers of 8 inches or more, and the other sub-line is for wafers of 6 inches or less without being limited thereto. If required, there may be employed a specification in which wafers of different sizes of 6 inches or less, for example, 5 inches and 2 inches are combined with each other.

Further, a processing unit to be connected to a respective sub-line is plug-in configured. Thus, the transport system or processing unit can be easily replaced, added to or removed. Further, addition or removal can be easily carried out in units of lines in which a series of processing units is connected to each other without being limited to units of units.

As described above, in the present embodiment, processing units are disposed relevant to wafers of different sizes in accordance with similar specifications for processing steps which can cope with a change of production quantity (yield) without greatly changing production efficiency. In addition, in one sub-line, a processing unit is disposed in accordance with the specification for highly fine processing the wafer. In the other line, a processing unit is disposed in accordance with the specification for less fine processing the wafer. The processing units can thereby be adapted to specific processes, thus reducing the processing machine cost.

Figure 9:
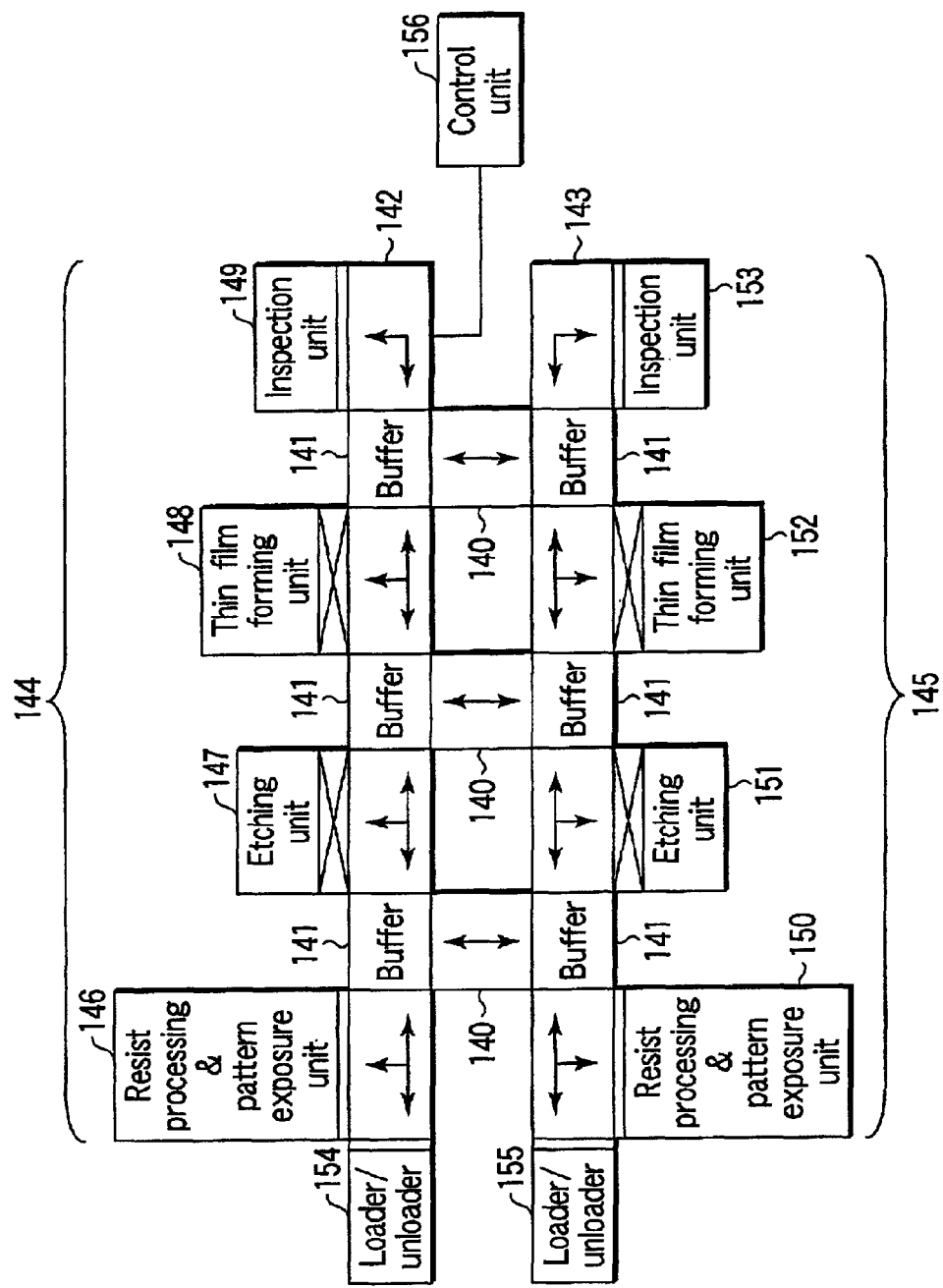
FIG. 9 is a view showing an exemplary conceptual configuration of a manufacturing line having two mutually connected sub-lines according to a fifth embodiment.

FIG. 9 illustrates a manufacturing line for processing wafers of the same sizes with a plug-in configuration according to a fifth embodiment.

In the present embodiment, there is provided a manufacturing line in which a plurality of transport systems (sub-lines) carrying wafers of the same sizes are linked with several path lines 140 so as to be mutually carried, and a series of plural processing units each forming an integrated circuit or the like on wafers of such sizes are configured to be linked with the transport system.

As shown in FIG. 9, the manufacturing line according to the present embodiment consists of two sub-lines, wherein processing unit groups 144 and 145 each applying a series of processes for forming an integrated circuit or the like on a wafer are configured to be linked with two sub-lines 142 and 143 each consisting of a transport system in which a plurality of buffer chambers 141 are intervened. Three path lines 140 for delivering a wafer between lines are provided in the middle of these transport systems.

In the processing unit groups 144 and 145, the resist processing and pattern exposure unit 146 and 150; etching units 147 and 151; thin film forming units 148 and 152; and inspection units 149 and 153 are connected by plugging them in. In addition, loaders/unloaders 154 and 155 and a control unit 156 for controlling the entirety are provided at the respective sub-lines (transport systems) 142 and 143.

Although a transport system in the present embodiment is of a single wafer mode in which wafers are carried one by one, in the case where the throughputs of processing units are remarkably different from each other, the storage capacity of a buffer chamber may be changed or a system for carrying the wafer together with the cassette may be employed without being limited to carrying of a path line on a single wafer mode.

In addition, in the case where there is employed a unit for processing a large amount of wafers simultaneously by storing a plurality of wafers in a vertical stock or boat, like a CVD unit or thermally oxide film forming unit, for example, this unit is made compatible with the buffer chamber.

In the thus configured manufacturing line, a wafer is delivered between sub-lines by utilizing a path line, whereby a processing unit in accordance with different specifications can be utilized. For example, as in the etching of an oxide film and a metal, in the case of an etching unit in accordance with a different specification, an oxide film etching unit is disposed in one sub-line, and a metal etching unit is disposed in the other sub-line without disposing two etching units, i.e., one type of etching unit for each sub-line, and processing is carried out through a path line, whereby processing can be carried out efficiently.

Figure 10:
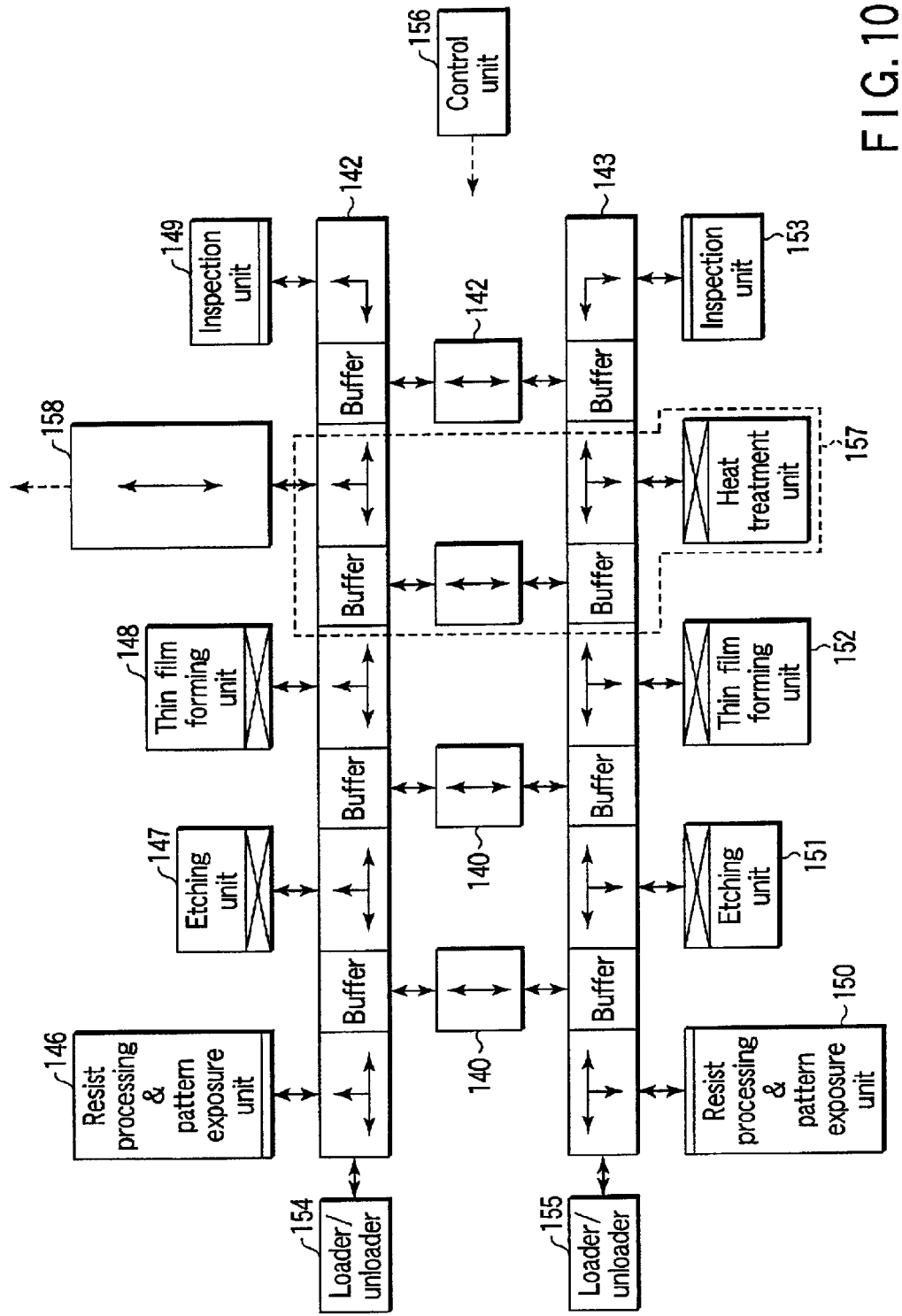
FIG. 10 is an illustrative view of a plug-in configuration according to the fifth embodiment.
Figure 11:
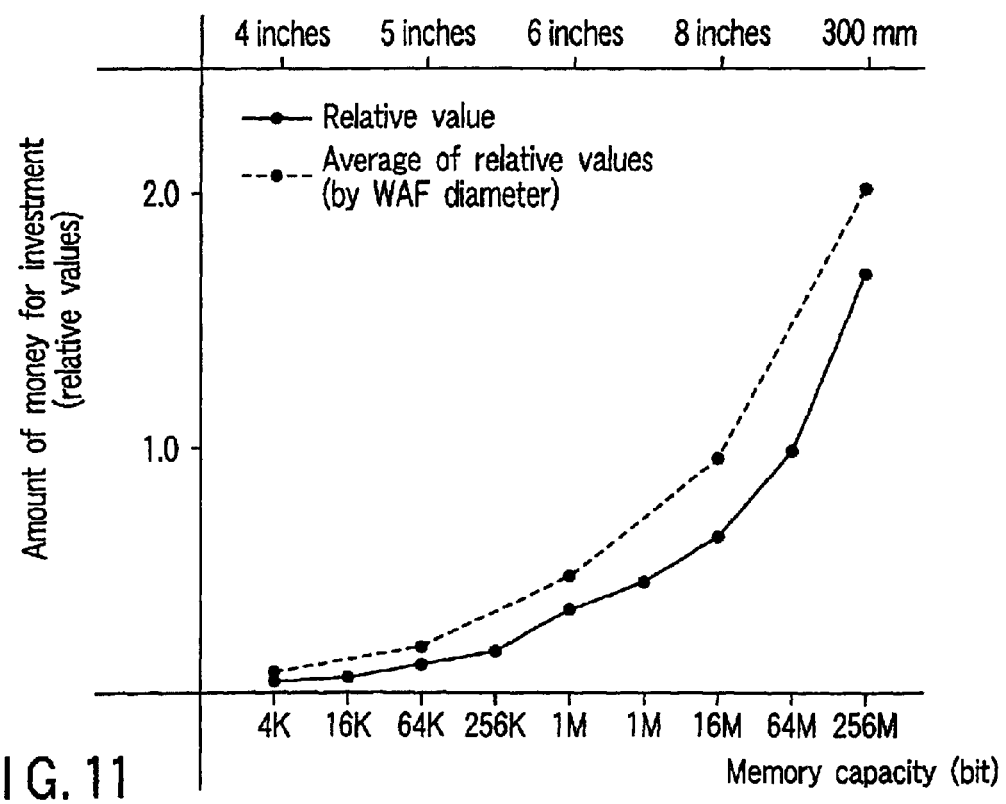
FIG. 11 is a view showing the relative relationship between the amount of money for investment and memory capacity in a wafer diameter.
Figure 12:
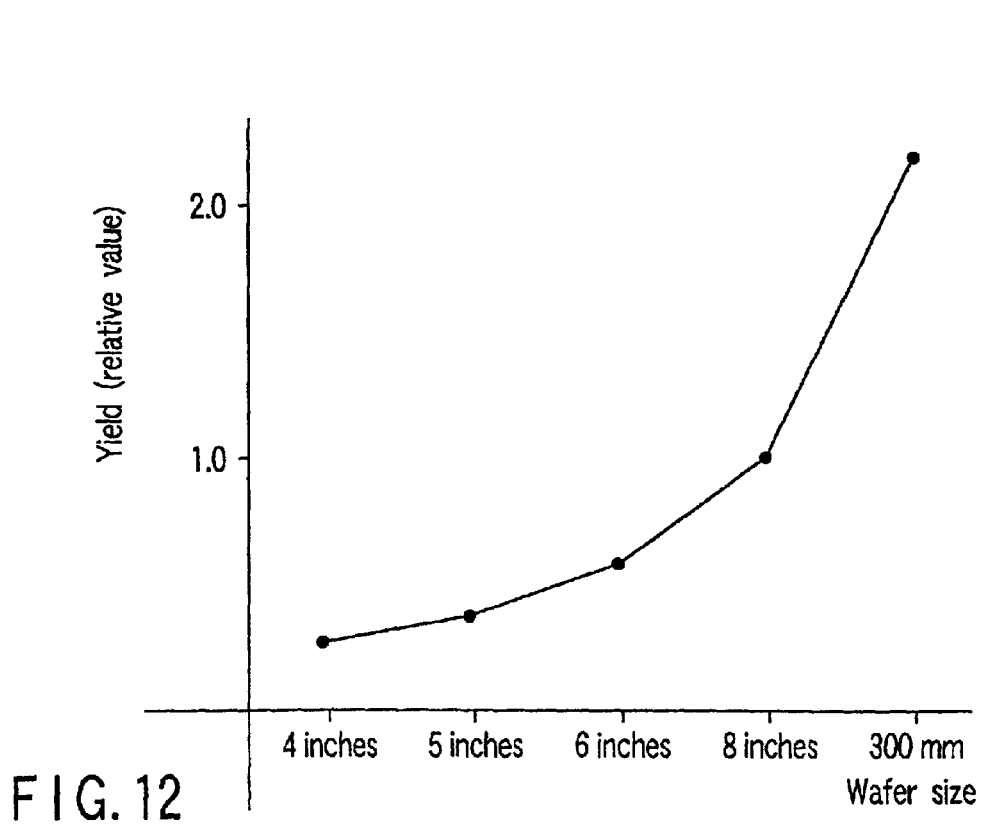
FIG. 12 is a view showing the relationship between wafer diameter (area of an integrated circuit forming region) and yield of a semiconductor device.
Figure 13:
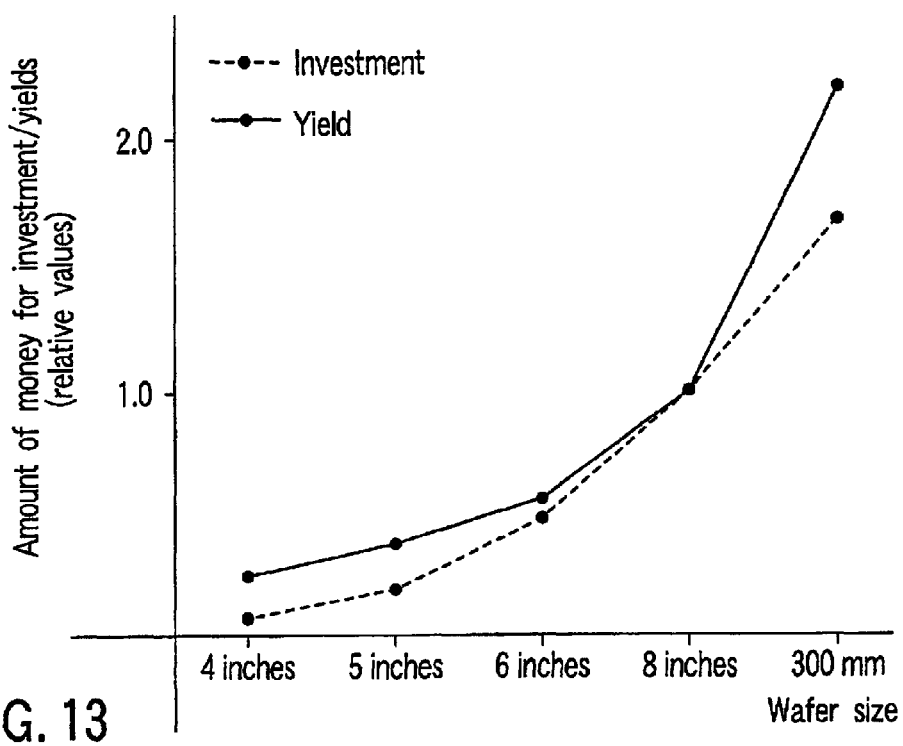
FIG. 13 is a view showing the relationship between the relative value of the amount of money for investment and relative value of yield relevant to each wafer diameter.
Figure 14:
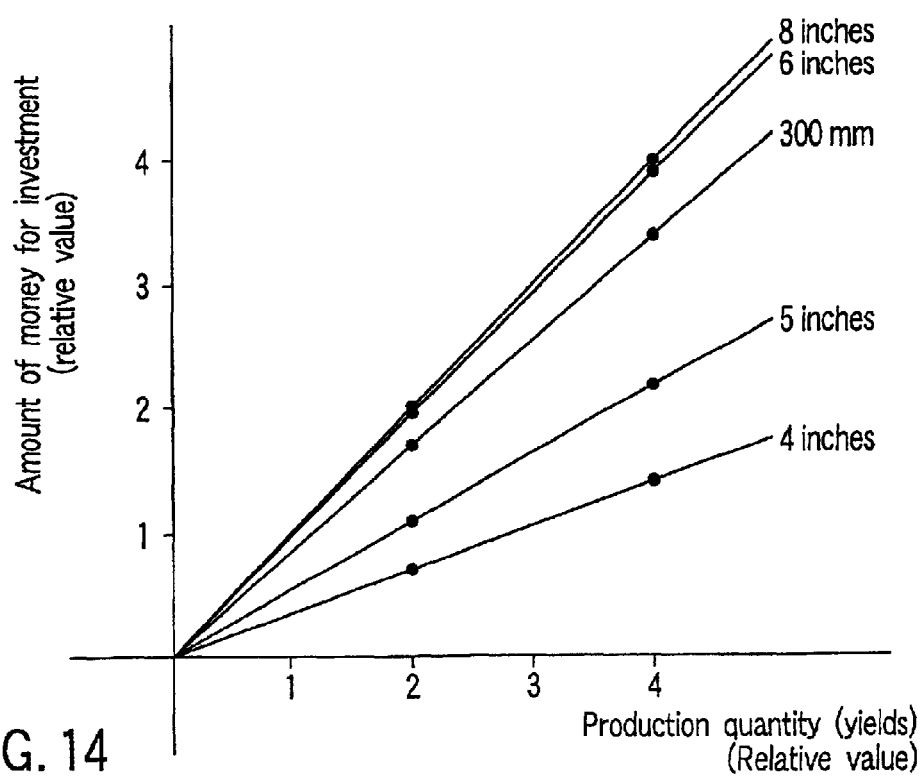
FIG. 14 is a view showing the relationship between the relative value of the amount of money for investment and the production quantity (yield) for each wafer size.

Similarly, as shown in FIG. 10, for example, one heat treatment unit 157 is added by way of a plug-in connection, whereby this unit can be utilized for all wafers processed in two sub-lines. In this case, unless an unused transport system or a buffer chamber exists, transport systems, buffer chambers, and heat treatment chambers 157 are added as a package.

Further, an adjacent sub-line (not shown) for processing adjacent wafers of the one size is linked with a path line 158, whereby a processing unit disposed in the adjacent sub-line can be utilized.

As has been described above, in the present embodiment, a plurality of sub-lines are linked with each other via a path line, whereby efficient operation of a processing unit can be achieved.

In addition, in the case where a product type and a processing step are changed, the changed product is carried to a sub-line in which the corresponding processing unit is disposed through a path line, and processing is carried out, whereby a flexible support can be achieved within a short time without stopping the operation of a manufacturing line or replacement or addition of a processing unit, as was conventionally practiced, and easy support can be achieved merely by changing the control system, without lowering the manufacturing efficiency or provision of requiring extra processing units.

In particular, in a manufacturing line consisting of a plurality of sub-lines, a program is created in advance so as to enable carrying and processing corresponding to a variety of processing steps, whereby easy and flexible support for changes in the processing steps can be achieved merely by specifying the program or setting the processing conditions.

In addition, in the manufacturing line according to the present invention, when a wafer of 6 inches or less in diameter is employed, in the case of forming an integrated circuit that includes a transistor having 0.3 $\mu$m or less in gate length, four or less integrated circuits are formed for each wafer, In addition, in the case of a wafer of about 2 inches or less in diameter, one integrated circuit is manufactured.

In this way, reducing the number of integrated circuits for each wafer can easy answer requirements for controllability over product type for a variety of small quantity productions. Even if a number of chips are formed all over the wafer, desired processing precision cannot be achieved, and yield is lowered in a region close to a peripheral edge. As a result, only a small number of acceptable products can be obtained in many cases.

Therefore, in the present embodiment, a region for forming an integrated circuit is limited to a region in which desired processing precision can be expected. For example, an integrated circuit is formed only in a region such as a center of a wafer surface or an intermediate portion between the center and the peripheral edge, and high yields are achieved. Forming an integrated circuit only in a region in which a high yield can be expected leads to improvement of throughput in the exposure step. From the above circumstance, a method of forming four or less integrated circuits in a wafer of 6 inches or less or one integrated circuit in a wafer of 2 inches may be preferred.

Recently, as in a so called system on-chip, there is an increasing needs for forming an integrated circuit of large size that has not existed conventionally, and an increased number of cases in which the above method is effective can be expected.

Further, in a manufacturing line, fine processing of 0.3 $\mu$m or less is performed in at least one of the etching steps, and a wafer having a size that less than 300 integrated circuits that can be provided in one wafer is to be processed.

As described in another part of the specification, when an integrated circuit of 0.3 $\mu$m or less in minimum processing dimensions, is manufactured, employing a semiconductor substrate of 6 inches or less in diameter is more advantageous than employing a semiconductor (silicon) wafer of a large diameter. In this case, typically less than 300 integrated circuits are formed for each wafer.

In the manufacturing line described in FIG. 4 to FIG. 10, processing units in the entire line or constituent units in a processing chamber are described so as to be controlled at one control unit. Of course, although one control unit may control the entirety, this is conceptually shown for clarity. In actuality, in the case of constructing this manufacturing line, a control unit is provided for each processing unit or each processing chamber, and a design may be made such that there is provided a host-like control unit for sending an integral instruction to these controls.

In the previously described first embodiment, a wafer of 6 inches or less in wafer size is targeted to be processed because, in the case where the following conditions are met, the yield of 6-inch wafers is larger than that of 300 mm and 8 inches. Hereinafter, a description will be given in detail.

[1] The yield of semiconductor devices may meet the following conditions for each wafer.

Effective wafer area/chip size=yields per wafer (Yield$\leq$1)
Effective area=(wafer radius$-$2 mm)$^2\pi$ Here, the reason for the reduction of 2 mm is that an integrated circuit cannot be formed in a region within 2 mm of the wafer periphery.

[2] When the processing units for processing wafers of a small diameter (6 inches or less) satisfy the following conditions, they can be employed. The same yield is set forth as a premise.

(1) For a rough estimate of the amount of money needed for investment

Amount of money for investment required to construct a semiconductor manufacturing line for an 8-inch wafer=A Amount of money for investment required to construct a semiconductor manufacturing line for a wafer of a small diameter $$n \times A \geq B(n \leq 0.6)$$

The yield of 6-inch wafers is about 0.6 times as large as that of 8-inch wafers. Thus, there is no advantage unless an amount of money for investment in a semiconductor manufacturing line for a wafer of its small diameter has been 0.6 times or less as compared with an 8-inch wafer.

(2) energy consumption base

Total amount of money (total volume) for energy used in a semiconductor manufacturing line for 8-inch wafer=C Total amount of money (total volume) for energy used in a semiconductor manufacturing line of for a wafer of its small diameter=D $$n \times C \geq D(n \leq 0.6)$$

As in the case of (1), there is no advantage unless use energy in a semiconductor line for a wafer of its small diameter has been 0.6 times as compared with an 8-inch wafer.

(3) Throughput base

Processing unit throughput in a semiconductor manufacturing line for an 8-inch wafer: E Processing unit throughput in a semiconductor, manufacturing line for a wafer of smaller diameter=F $$m \times E \leq F(m \geq 1.1)$$

The wafer of smaller diameter is small in carrying stroke, and thus, the throughput of 6-inch wafer processing unit should be about 1.1 times the 8-inch wafer processing unit. Therefore, the throughput of a semiconductor manufacturing line for a wafer of a small diameter can be expected to be about 1.1 times or more than that of an 8-inch wafer.

(4) Foot space base

Foot space for processing unit for 8-inch wafer=G

Foot space for processing unit for wafer of small diameter=H $$n \times G \geq H(n \leq 0.7)$$

The use of a wafer of a small diameter can reduce a processing unit, and thus, the throughput of a 6-inch wafer processing unit should be about 0.7 times of an 8-inch wafer processing unit. Therefore, the foot space (occupying area) for a processing unit for a wafer of a small diameter can be expected to be about 0.7 times or less as compared with an 8-inch wafer processing unit.

INDUSTRIAL APPLICABILITY

By implementing the processing unit and the sub-line of the present invention, investment efficiency of a wafer of small diameter is improved than the yield of a wafer of 300 mm at the same cost, and the space needed for a processing unit or manufacturing line in a factory can be reduced. A factory clean room construction cost or its maintenance cost as well as raw material cost or equipment cost can be reduced.

According to the present invention, as has been described above in detail, there is provided a semiconductor device manufacturing method and its manufacturing line, wherein an integrated circuit of 0.3 μm or less in the minimum processing dimension of constituent elements formed on a semiconductor substrate is formed at a low cost on the semiconductor wafer, the manufacturing method and manufacturing line being capable of easily and flexibly coping with a change of processing steps and capable of coping with a plurality of wafer sizes.

What is claimed is:

1. A semiconductor device manufacturing line for applying a series of processes to a semiconductor substrate, and forming an integrated circuit on the semiconductor substrate, wherein said manufacturing line includes two sub-lines, each of said sub-lines is composed of a series of processing units including a film forming unit, a pattern exposure unit, an etching unit, and a test unit, fine processing of 0.3 μm or less can be performed in at least one pattern exposure unit and one etching unit, a series of processing units in one of said sub-lines conforms to specification corresponding to a semiconductor substrate of 150 mm (6 inches) or less in diameter, and the series of processing units in the other sub-line conform to specification corresponding to a semiconductor substrate of 200 mm (8 inches) or more in diameter.

2. A semiconductor device manufacturing method in which a series of processes are applied to a semiconductor substrate, to form on said semiconductor substrate, two or more types of integrated circuits of different chip sizes any of which has the minimum processing line widths is 0.3 μm or less, wherein an integrated circuit of a first type is manufactured by employing a semiconductor substrate of a first diameter, and a semiconductor device is manufactured by employing a semiconductor substrate of a second diameter different from said first diameter.

3. A semiconductor device manufacturing method in which a series of processes is applied to a semiconductor substrate, to form on said semiconductor substrate, two or more types of integrated circuit of different chip sizes any of which has the minimum processing line widths is 0.3 μm or less are formed, wherein an integrated circuit of a first type is formed by a series of processing units in accordance with the specification for processing a semiconductor substrate of 150 mm (6 inches) or less in diameter, an integrated circuit of a second type is formed by a series of processing units in accordance with specification for processing a semiconductor substrate of substantially 200 mm (8 inches) in diameter.

4. A semiconductor device manufacturing line for applying a series of processes to a semiconductor substrate and forming an integrated circuit on said semiconductor substrate, wherein said manufacturing line includes two sub-lines, each of said sub-lines is composed of a series of processing units including a film forming unit, a pattern exposure unit, an etching unit, and a test unit, fine processing of 0.3 μm or less can be done in at least one pattern exposure unit and one etching unit, and said sub-lines are identical to each other.

5. A semiconductor device manufacturing line for applying a series of processes to a semiconductor substrate and forming an integrated circuit on said semiconductor substrate, wherein said manufacturing line includes two sub-lines in accordance with the same specification, each of said sub-lines is composed of a series of processing units including a film forming unit, a pattern exposure unit, an etching unit, and a test unit, fine processing of 0.3 μm or less can be done in at least one pattern exposure unit and one etching unit, and further, there is provided means for mutually carrying a semiconductor substrate in the middle of processing between said two sub-lines.

6. A semiconductor device manufacturing method comprising processing steps in which the minimum processing dimension of constituent elements formed on a semiconductor substrate is 0.3 μm or less, wherein, in order to make a wafer of 150 mm (6 inches) or less in diameter targeted to be processed, when an amount of money for investment required to construct a semiconductor manufacturing line for a wafer exceeding 6 inches is first defined to be equal to A with respect to a cost for constructing a manufacturing line, and an amount of money for investment required to construct a semiconductor manufacturing line for a wafer of 150 mm (6 inches) or less is defined to be equal to B, n×A≧B (n≦0.6) is met; secondly, in an energy cost associated with a manufacture, when a total amount of money (a total quantity) for energy used in a semiconductor manufacturing line: for a wafer exceeding 150 mm (6 inches) is defined to be equal to C, and a total amount of money (a total quantity) of energy used in a semiconductor manufacturing line for a wafer of 6 inches or less is defined to be equal to D, n×C≧D (n≦0.6) is met; thirdly, as a throughput base, when a processing unit throughput in a semiconductor manufacturing line for a wafer exceeding 6 inches is defined to equal to E, and a processing unit throughput in a semiconductor manufacturing line for a wafer of 150 mm (6 inches) or less is defined to be equal to E, m×E≦F (m≧1.1) is met; and, fourthly, as a foot space, when a foot space for a processing unit of a wafer exceeding 150 mm (6 inches) is defined to be equal to G, and a foot space for a processing unit of a wafer of 150 mm (6 inches) or less is defined to be equal to H, n×G≧H (n≦0.7) is met, whereby manufacturing yield of a wafer of 150 mm (6 inches) or less and the cost according to its manufacturing yield are reduced more remarkably than those according a wafer exceeding 150 mm (6inches).

7. A manufacturing line in which a plurality of processing units for applying a series of processes for forming an integrated circuit on a semiconductor wafer of one size is disposed in a one-line transport system, said manufacturing line comprising:

a semiconductor wafer import/export unit for importing or exporting a predetermined semiconductor wafer from the outside;

a first processing unit for carrying out cleaning for forming a circuit element on said semiconductor wafer;

a second processing unit for forming a metal film or an insulation film on said semiconductor substrate;

a third processing unit for forming a resist pattern for forming a circuit element or a wire on said thin film formed semiconductor wafer;

a fourth processing unit for removing an unnecessary metal film portion or insulation film portion on which said resist pattern is formed; and a fifth processing unit for optically and electrically inspecting an integrated circuit element formed on said semiconductor wafer, wherein said each processing unit is removably linked with said transport system by means of plug-in.

8. A manufacturing line in which a plurality of processing units for applying a series of processes for forming an integrated circuit on a semiconductor wafer is disposed in a transport system, said manufacturing line comprising:

a pre-processing section in which a processing for carrying out cleaning for forming a circuit element on said semiconductor wafer is connected to a first transport system portion;

a thin film forming section in which a processing unit for forming a metal film or an insulation film on said semiconductor substrate is connected to a second transport system portion;

a patterning section for forming a resist pattern for forming a circuit element or a wire on a thin-film formed semiconductor wafer connected to a third transport system portion;

an etching section for removing an unnecessary metal film portion or insulation film portion of a semiconductor wafer connected to a fourth transport system portion; and an inspection section for optically and electrically inspecting an integrated circuit element formed on said semiconductor waiver connected to a fifth transport system portion, wherein said first to fifth transport system portions are arbitrarily linked in series or are linked circularly, and said semiconductor wafer is carried to said each desired section.

9. A manufacturing line as claimed in claim 8, wherein a processing unit disposed in a patterning section and an etching section of said manufacturing line processes the minimum processing dimensions of a resist pattern formed on said semiconductor substrate, constituent elements of a circuit element, or wiring pattern to be 0.3 μm or less.

10. A plurality of manufacturing lines in which a plurality of processing units for applying a series of processes for forming an integrated circuit onto semiconductor wafers of different sizes are disposed at a transport system, each of the manufacturing lines comprising:

a semiconductor wafer import/export unit for importing or exporting a desired semiconductor wafer from the outside;

a first processing unit for carrying out cleaning for forming a circuit element on said semiconductor wafer;

a second processing unit for forming a metal film or an insulation film on said semiconductor substrate;

a third processing unit for forming a resist pattern for forming a circuit element or a wire on said thin-film formed semiconductor wafer;

a fourth processing unit for removing unnecessary metal film portion or insulation film portion of a semiconductor wafer on which the resist pattern is formed; and a fifth processing unit for optically and electrically inspecting an integrated circuit element formed on the semiconductor wafer, wherein said each processing unit is removably linked with each transport system by plugging it in.

11. A manufacturing line wherein a plurality of processing systems for applying a series of processes for forming an integrated circuit on semiconductor wafers of the same sizes are disposed, a plurality of manufacturing lines in which a plurality of transport systems having functions for mounting and housing a semiconductor wafer in a respective one of said processing units are linked with each other while buffers for temporarily housing said semiconductor wafer are intervened respectively, the transport systems of said adjacent manufacturing lines are linked with each other via a path line for delivering said semiconductor wafer, a semiconductor wafer is carried to an arbitrary processing unit on arrayed manufacturing lines, and processing is carried out.

12. A semiconductor device manufacturing line comprising:

first carrying means having at least one processing unit connected thereto;

second carrying means having another processing unit connected thereto, and the second carrying means being connected to said first carrying means;

third carrying means having still another processing unit connected thereto, the third carrying means being connected to said second carrying means;

fourth carrying means having yet another processing unit connected thereto, the fourth carrying means being connected to said first carrying means and third carrying means.

13. A manufacturing line in which a plurality of processing units for applying a series of processes for forming an integrated circuit on a semiconductor wafer of one size is disposed in a one-line transport system, said manufacturing line comprising:

a semiconductor wafer import/export unit for importing or exporting a predetermined semiconductor wafer from the outside;

a first processing unit for carrying out cleaning for forming a circuit element on said semiconductor wafer;

a second processing unit for forming a metal film or an insulation film on said semiconductor substrate;

a third processing unit for forming a resist pattern for forming a circuit element or a wire on said thin film formed semiconductor wafer;

a fourth processing unit for removing an unnecessary metal film portion or insulation film portion; and a fifth processing unit for inspecting an integrated circuit formed on said semiconductor wafer, wherein said each processing unit is removably linked with said transport system by means of plug-in.

14. A manufacturing line in which a plurality of processing units for applying a series of processes for forming an integrated circuit on a semiconductor wafer is disposed in a transport system, said manufacturing line comprising:

a pre-processing section in which a processing for carrying out cleaning for forming a circuit element on said semiconductor wafer is connected to a first transport system portion;

a thin film forming section in which a processing unit for forming a metal film or an insulation film on said semiconductor substrate is connected to a second transport system portion;

a patterning section for forming a resist pattern for forming a circuit element or a wire on a thin-film formed semiconductor wafer connected to a third transport system portion;

an etching section for removing an unnecessary metal film portion or insulation film portion of a semiconductor wafer connected to a fourth transport system portion; and an inspection section for inspecting an integrated circuit formed on said semiconductor waiver connected to a fifth transport system portion, wherein said first to fifth transport system portions are arbitrarily linked in series or are linked circularly, and said semiconductor wafer is carried to said each desired section.

15. A manufacturing line as claimed in claim 14, wherein a processing unit disposed in a patterning section and an etching section of said manufacturing line processes the minimum processing dimensions of a resist pattern formed on said semiconductor substrate, constituent elements of a circuit element, or wiring pattern to be 0.3 $\mu$m or less.

16. A plurality of manufacturing lines in which a plurality of processing units for applying a series of processes for forming an integrated circuit onto semiconductor wafers of different sizes are disposed at a transport system, each of the manufacturing lines comprising:

a semiconductor wafer import/export unit for importing or exporting a desired semiconductor wafer from the outside;

a first processing unit for carrying out cleaning for forming a circuit on said semiconductor wafer;

a second processing unit for forming a metal film or an insulation film on said semiconductor substrate;

a third processing unit for forming a resist pattern for forming a circuit element or a wire on said thin-film formed semiconductor wafer;

a fourth processing unit for removing unnecessary metal film portion or insulation film portion of a semiconductor wafer; and a fifth processing unit for inspecting an integrated circuit formed on the semiconductor wafer, wherein said each processing unit is removably linked with each transport system by plugging it in.

* * * * *